United States Patent
Sakida et al.

(10) Patent No.: US 7,727,483 B2
(45) Date of Patent: Jun. 1, 2010

(54) REACTOR FOR CHLOROSILANE COMPOUND

(75) Inventors: Manabu Sakida, Shunan (JP); Satoru Wakamatsu, Shunan (JP)

(73) Assignee: Tokuyama Corporation, Shunan-shi (JP)

( * ) Notice: Subject to any disclaimer, the term of this patent is extended or adjusted under 35 U.S.C. 154(b) by 518 days.

(21) Appl. No.: 11/660,414

(22) PCT Filed: Aug. 17, 2005

(86) PCT No.: PCT/JP2005/014997

§ 371 (c)(1),
(2), (4) Date: Feb. 16, 2007

(87) PCT Pub. No.: WO2006/019110

PCT Pub. Date: Feb. 23, 2006

(65) Prior Publication Data

US 2007/0264173 A1 Nov. 15, 2007

(30) Foreign Application Priority Data

Aug. 19, 2004 (JP) .............................. 2004-239516

(51) Int. Cl.
*B01J 12/00* (2006.01)
*B01J 19/00* (2006.01)
*C23C 16/00* (2006.01)

(52) U.S. Cl. ........................ 422/129; 422/198; 118/724; 118/725

(58) Field of Classification Search ................. 422/129, 422/198; 117/200; 118/724, 725
See application file for complete search history.

(56) References Cited

U.S. PATENT DOCUMENTS

| 4,132,763 | A | * | 1/1979 | Schmidt et al. | ............. | 423/350 |
| 5,126,112 | A | * | 6/1992 | Burgie | ......................... | 422/241 |
| 5,259,856 | A | * | 11/1993 | Ohga et al. | .................... | 65/426 |
| 7,413,718 | B2 | * | 8/2008 | Nakamura et al. | ........... | 422/198 |
| 2002/0104474 | A1 | * | 8/2002 | Wakamatsu et al. | ............. | 117/2 |
| 2007/0034146 | A1 | * | 2/2007 | Nakashima et al. | ......... | 117/200 |

FOREIGN PATENT DOCUMENTS

| JP | 9-157073 | A |   | 6/1997 |
| JP | 2002-029726 | A |   | 1/2002 |
| JP | 2003-02627 | A |   | 1/2003 |
| JP | 2003002627 | A | * | 1/2003 |
| JP | 2003020217 | A | * | 1/2003 |
| JP | 2003-054933 | A |   | 2/2003 |
| JP | 2004-002138 | A |   | 1/2004 |

* cited by examiner

*Primary Examiner*—Walter D Griffin
*Assistant Examiner*—Natasha Young
(74) *Attorney, Agent, or Firm*—The Webb Law Firm

(57) ABSTRACT

In a reaction apparatus of the chlorosilanes for heating a reaction portion that is a section from the bottom end portion to a specified height in the carbon reaction vessel and that has an inside face to which silicon has deposited, and for reacting the chlorosilanes by making the chlorosilanes and hydrogen to come into contact with the inside face of the reaction portion, a gas penetration preventing processing for preventing the chlorosilanes supplied to the reaction vessel from penetrating a pipe wall of the non reaction portion in the reaction vessel is carried out to the inside face and/or the outside face of the non reaction portion on the side upper than the reaction portion in the reaction vessel.

3 Claims, 2 Drawing Sheets

US 7,727,483 B2

REACTOR FOR CHLOROSILANE COMPOUND

TECHNICAL FIELD

The present invention relates to a reaction apparatus of the chlorosilanes for reacting the chlorosilanes by supplying the chlorosilanes and hydrogen to a tubular reaction vessel from a gas supply port formed on an upper side of the reaction vessel made of a carbon material and by making the chlorosilanes and hydrogen to come into contact with an inside face to which silicon has deposited for the reaction vessel heated up to at least a temperature at which a reaction occurs.

BACKGROUND ART

Conventionally, many kinds of methods of manufacturing silicon that is used as a raw material of a semiconductor and a solar battery for power generation have been known. Some of the above methods have already been implemented industrially.

For instance, one of above methods is called a Siemens method. In this method, a silicon rod that has been heated up to a deposition temperature of silicon by energizing is disposed in a bell jar, and trichlorosilane ($SiHCl_3$) and monosilane ($SiH_4$) are made to come into contact with the silicon rod together with a reducing gas such as hydrogen to deposit silicon.

This method, by which high purity silicon can be obtained, is implemented industrially as a general method. However, since silicon is deposited in a batch system, it is necessary to repeat for each batch a series of processes such as installing of a silicon rod that is a seed, energizing, heating, depositing, cooling, and extracting of the silicon rod, and cleaning of the bell jar, thereby requiring complicated operations.

On the other hand, as a method capable of continuously manufacturing polycrystal silicon, a method using an apparatus shown in FIG. 1 is proposed (see Patent documents 1 and 2). This silicon manufacturing apparatus is provided with a reaction vessel 2 made of a carbon material, a raw gas supply port 5 that is disposed on an upper side of the reaction vessel 2 and that supplies the chlorosilanes and hydrogen into the reaction vessel 2, and a high frequency heating coil 7 disposed on the periphery of the reaction vessel 2 in a closed container 1.

The reaction vessel 2 is heated by an electromagnetic wave emitted from the high frequency heating coil 7 disposed on the periphery thereof. A section from a bottom end portion 2a of the reaction vessel 2 to a specified height (a region enclosed by the alternate long and two short dashes line in the figure: reaction portion 3a) is heated up to a temperature at which silicon can be deposited.

The chlorosilanes supplied from the raw gas supply port 5 is made to come into contact with the heated inside face of the reaction vessel 2 to deposit silicon to the inside face of the reaction portion 3a.

In the apparatus shown in the figure, the reaction portion 3a is heated up to a temperature less than a melting point of silicon at which silicon can be deposited, and silicon is deposited in a solid state. The reaction portion 3a is then heated up to a temperature equivalent to or higher than a melting point of silicon, and the part or whole of a deposited substance is molten, dropped from an opening of the bottom end portion 2a, and recovered in a cooling recovery chamber (not shown) disposed in a dropping direction.

Moreover, there is another method in which the inside face of the reaction vessel 2 is heated up to a temperature equivalent to or higher than a melting point of silicon to deposit silicon in a molten state, and a silicon molten solvent is continuously dropped from an opening of the bottom end portion 2a of the reaction vessel 2 and is recovered.

Since a silicon deposition in a region other than the inside face of the reaction vessel 2 in the closed container 1 causes an operation to be prevented, the sealing gas supply port 8 for supplying a sealing gas such as hydrogen and an inert gas is formed for instance at a region in which silicon must be prevented from being deposited, such as a region around the bottom end portion 2a of the reaction vessel 2, in order to prevent a silicon deposition.

Moreover, an apparatus similar to one shown in FIG. 1 is used for other applications as a reaction apparatus of the chlorosilanes for reacting the chlorosilanes and hydrogen by a hydrogen reducing reaction. For instance, an apparatus similar to one shown in FIG. 1 is used for reducing silicon tetrachloride to trichlorosilane in order to recover a raw gas for manufacturing polycrystalline silicon.

Even in this case, silicon is deposited to the reaction portion 3a heated up to a temperature at which a hydrogen reducing reaction occurs by an electromagnetic wave emitted from the high frequency heating coil 7. Silicon tetrachloride is then reduced to trichlorosilane by making silicon tetrachloride and hydrogen that have been supplied from the raw gas supply port 5 to come into contact with an inside face of the reaction portion 3a to which silicon has deposited. A gas after the reaction is recovered in a portion outside the closed container 1 through an opening of the bottom end portion 2a of the reaction vessel 2.

Patent document 1: Japanese Laid-Open Patent Publication No. 2003-2627
Patent document 2: Japanese Laid-Open Patent Publication No. 2002-29726

In a silicon manufacturing apparatus as shown in FIG. 1, a reaction vessel 2 is made of a carbon material. Silicon coats a carbon face of the inside face of the reaction portion 3a, or a silicon carbide film formed by a reaction between silicon and carbon coats the carbon face. However, a perforated carbon face is exposed on a non reaction portion 3b (a region enclosed by the alternate long and short dash line in the figure) on the upper side of the reaction portion 3a.

Since the chlorosilanes such as trichlorosilane is a molecule having an extremely large viscous resistance, a person with an ordinary skill in the art has never thought conventionally that such the chlorosilanes penetrate a pipe wall at the non reaction portion 3b of the reaction vessel 2 and leak externally. In practice, such a phenomenon has never occurred conventionally.

However, in the case in which a mole ratio of hydrogen in a raw gas is increased, trichlorosilane is effectively decomposed and a deposition efficiency of silicon is improved. Therefore, in the case in which a mole ratio of hydrogen to trichlorosilane was increased and an amount of hydrogen exceeded a certain mole ratio, there was a phenomenon in which trichlorosilane together with hydrogen penetrated a pipe wall of the reaction vessel to leak externally.

In a silicon manufacturing apparatus described above, by shortening an inner diameter of the reaction vessel at the intermediate section and by making an internal shape of the reaction vessel complicated, a gas flow resistance change section such as an orifice and a curved pipe portion is formed in the reaction vessel, and a differential pressure is set between an inlet on the upper side and an outlet on the bottom end portion side in the reaction portion (a numeral 3a in FIG. 1), thereby improving a contact efficiency of a raw gas and accelerating a reaction.

However, in many cases, the above phenomenon in which the chlorosilanes such as trichlorosilane together with hydrogen penetrates a pipe wall of the reaction vessel to leak externally occurs in the case in which a differential pressure is applied inside the reaction vessel in particular.

In the case in which the chlorosilanes supplied to the reaction vessel penetrate a pipe wall and leak externally, an outside face of the reaction vessel and a heat insulating member installed outside the reaction vessel are deteriorated. In addition, in some cases, silicon is deposited to other members and apparatuses.

The present invention was made in order to solve the above described problems. An object of the present invention is to provide a reaction apparatus of the chlorosilanes sufficiently capable of suppressing that a raw gas such as the chlorosilanes supplied into the reaction vessel penetrates a pipe wall of the reaction vessel to leak externally.

SUMMARY OF THE INVENTION

A reaction apparatus of the chlorosilanes related to the present invention for supplying the chlorosilanes and hydrogen to a reaction vessel from a gas supply port formed on an upper side of the reaction vessel made of a carbon material, for heating a reaction portion that is a section from the bottom end portion to a specified height in the reaction vessel and that has an inside face to which silicon has deposited, up to at least a temperature at which a reaction occurs, and for reacting the chlorosilanes by making the chlorosilanes and hydrogen to come into contact with the inside face of the reaction portion, is characterized in that a gas penetration preventing processing for preventing the chlorosilanes supplied to the reaction vessel from penetrating a pipe wall of the reaction vessel is carried out to the inside face and/or the outside face of the non reaction portion on the side upper than the reaction portion in the reaction vessel.

It is preferable that a gas penetration coefficient from the inside face to the outside face of the reaction vessel at the non reaction portion is $1 \times 10^{-3}$ cm$^2$/S or less.

According to a reaction apparatus of the chlorosilanes related to the present invention, it can be sufficiently suppressed that a raw gas such as the chlorosilanes supplied into the reaction vessel penetrates a pipe wall of the reaction vessel and leaks externally.

BEST MODE FOR CARRYING OUT THE INVENTION

An embodiment (example) of the present invention will be described below in detail with reference to the drawings. While the present invention can be applied to a reaction apparatus of the chlorosilanes having a similar apparatus configuration in addition to a silicon manufacturing apparatus shown in FIG. 1, for instance, to a reducing furnace of silicon tetrachloride, the following describes an example in which the present invention is applied to a silicon manufacturing apparatus.

Figure 1:
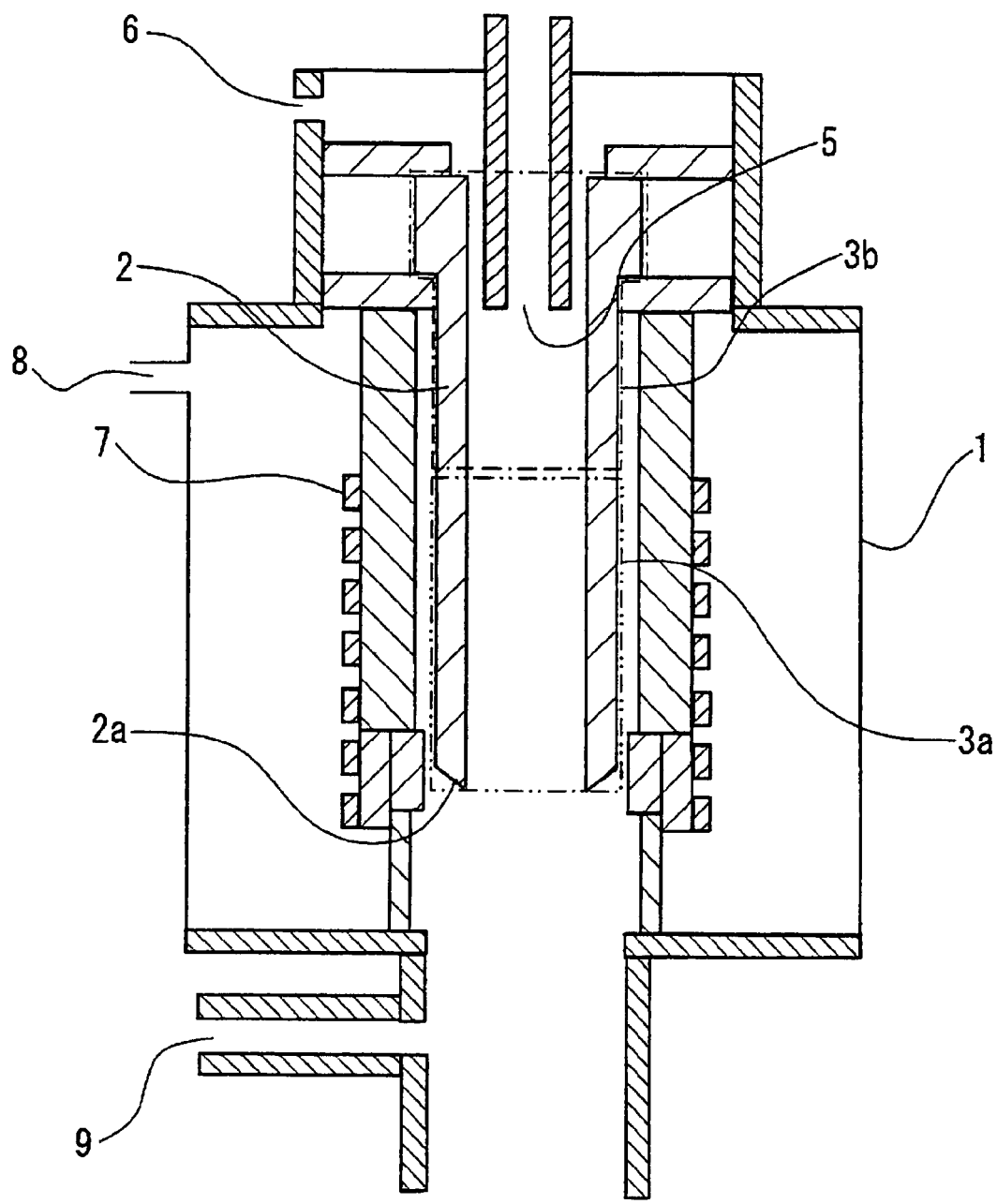
FIG. 1 is a cross-sectional view showing a silicon manufacturing apparatus for supplying the chlorosilanes and hydrogen from a gas supply port formed on an upper side of a reaction vessel made of a carbon material and for depositing silicon to the inside face of the reaction vessel heated.

The silicon manufacturing apparatus shown in FIG. 1 is provided with a tubular reaction vessel 2 in a closed container 1. By supplying the chlorosilanes from a raw gas supply port 5 disposed on an upper side of the reaction vessel 2, silicon is deposited on the inside wall of the reaction vessel 2 that has been heated by a high frequency heating coil 7.

As the chlorosilanes that are used for a reaction, there are mentioned, for instance, trichlorosilane (SiHCl$_3$, hereafter referred to as TCS) and silicon tetrachloride (SiCl$_4$, hereafter referred to as STC). In addition, there can be preferably used the chlorodisilanes such as dichlorosilane (SiH$_2$Cl$_2$), monochlorosilane (SiH$_3$Cl), and hexachlorodisilane (Si$_2$Cl$_6$), and the chlorotrisilanes such as octachlorotrisilane (Si$_3$Cl$_8$). While such the chlorosilanes can be individually used, at least two kinds of chlorosilanes can also be combined to be used.

Hydrogen that is used for a deposition reaction together with the chlorosilanes is supplied from, for instance, a raw gas supply port 5 or a separate raw gas supply port 6.

The reaction vessel 2 is made of a carbon material such as graphite, which can be heated by a high frequency and has a resistance at a melting point of silicon. The reaction vessel 2 is formed cylindrically for instance, and is disengaged downward from an opening of the bottom end portion 2a.

A shape of an opening at the bottom end portion 2a of the reaction vessel 2 can be straight downward or tapered to form a reduced or enlarged portion in such a manner that a diameter at a lower section is smaller or larger. A peripheral edge of the opening can be horizontal, inclined, or in a wave shape. By such a configuration, a silicon droplet can be easily dropped from the peripheral edge of the opening, a droplet of a silicon molten solvent can be uniformed, and a particle diameter of a silicon particle can be uniformly adjusted to be smaller.

The reaction vessel 2 is heated by an electromagnetic wave (a high frequency wave) emitted from the high frequency heating coil 7 disposed on the periphery thereof. An inside face of a region from a bottom end portion 2a of the reaction vessel 2 to a specified height (a region enclosed by the alternate long and two short dashes line in the figure: reaction portion 3a) is heated up to a temperature less than a melting point of silicon (approximately 1410 to 1430° C.), at which silicon can be deposited. A heated temperature of the reaction portion 3a is preferably 950° C. or higher, more preferably 1200° C. or higher, further preferably 1300° C. or higher.

For silicon that has been deposited on the inside face of the reaction vessel 2, after silicon is deposited in a solid state on the inside face of the reaction portion 3a of the reaction vessel 2, the inside face is heated up to a temperature equivalent to or higher than a melting point of silicon, and the part or whole of a deposited substance is molten, dropped from an opening of the bottom end portion 2a, and recovered in a cooling recovery chamber (not shown) disposed in a dropping direction.

Moreover, it is also possible that the reaction portion 3a of the reaction vessel 2 is heated up to a temperature equivalent to or higher than a melting point of silicon, silicon is deposited in a molten state to the inside face thereof, and a silicon molten solvent is continuously dropped from an opening of the bottom end portion 2a of the reaction vessel 2 and is recovered.

In general, the reaction portion 3a is a section with a length in the range of 30 to 90% of the total length of the reaction vessel 2 in the closed container 1. In order to prevent silicon from being deposited to the raw gas supply port 5 or the like, a section from the top edge with a length of 10% or more of the total length of the reaction vessel 2 in the closed container 1 is the non reaction portion 3b (a region enclosed by the alternate long and short dash line in the figure) in which silicon is not deposited. In the case in which the reaction vessel 2 is lengthened, the non reaction portion 3b is shortened relatively.

The high frequency heating coil 7 generates an electromagnetic wave to heat the reaction vessel 2 by energizing a coil from a power source (not shown). A frequency of the electromagnetic wave can be set to a proper value depending on a material or a shape of an object to be heated such as the reaction vessel 2, for instance, to a value in the range of several tens Hz to several tens GHz.

As a method of heating the reaction vessel 2 from the outside, there are mentioned a method using a heating wire and a method using infrared rays, in addition to a high frequency heating method.

Silicon dropped into the cooling recovery section is cooled by a solid coolant such as silicon, copper, and molybdenum, a liquid coolant such as liquid silicon tetrachloride and liquid nitrogen, or a cooling gas supplied from a cooling gas supply port if necessary.

Moreover, in such a manner that silicon can be more effectively cooled, a cooling jacket can be formed on the cooling recovery chamber, and cooling medium liquid such as water, thermal oil, and alcohol can pass through the cooling jacket for cooling. As a material of the cooling recovery chamber, there can be used, for instance, a metal material, a ceramics material, and a glass material. In such a manner that high-purity silicon can be recovered as well as this apparatus can be made firm as an industrial apparatus, it is preferable to carry out lining to the inside of the metal recovery chamber by using silicon, Teflon (registered trademark), a quartz glass or the like. It is also possible to dispose silicon particles at the bottom of the cooling recovery chamber. After a reaction, an exhaust gas in the reaction vessel 11 is exhausted from a gas exhaust port 3. If necessary, it is also possible to form an ejecting port for ejecting solidified silicon continuously or intermittently from the cooling recovery chamber.

Since a trouble in an apparatus operation occurs in the case in which silicon is deposited to a region other than the reaction portion 3a, such as a region around the bottom end portion 2a of the reaction vessel 2, and a gap between the reaction vessel 2 and a gas supply pipe forming the raw gas supply pipe 5, the sealing gas supply ports 6 and 8 or the like for supplying a sealing gas are formed at a region in which silicon must be prevented from being deposited in the closed container 1 in such a manner that the region is filled with a sealing gas atmosphere.

As a sealing gas, it is preferable to use a gas that does not generate silicon and that does not affect a generation of silicon in a region in which the chlorosilanes exist. More specifically, hydrogen or an inert gas such as argon and helium can be used.

Moreover, by introducing into a reaction system a reaction sample agent that can react to solid silicon deposited to a low-temperature section in the reaction system and by reacting silicon to the reaction sample agent, there can be avoided a problem that solid silicon is deposited to a nozzle portion or the like in the reaction system and chokes up the nozzle portion. As a reaction sample agent that can react to silicon, there can be mentioned for instance hydrogen chloride (HCl) and silicon tetrachloride.

The manufacturing conditions of the silicon manufacturing apparatus shown in FIG. 1 are not restricted. However, it is preferable to determine a supply ratio, a supply amount, and a staying time of the chlorosilanes and hydrogen in such a manner that the chlorosilanes and hydrogen are supplied to the silicon manufacturing apparatus to generate silicon under the condition in which a conversion rate from the chlorosilanes to silicon is 20% or higher, preferably 30% or higher.

In order to obtain a silicon manufacturing speed economical against a size of the reaction chamber, a molar fraction of the chlorosilanes in a supply gas is preferably in the range of 0.1 to 99.9 mole %, more preferably in the range of 5 to 50 mole %. While a higher reaction pressure has an advantage of miniaturizing an apparatus, a pressure of 0 to 1 MPaG can be easily implemented industrially.

While a staying time of a gas changes depending on the conditions of a pressure and a temperature to a reaction chamber having a constant capacity, an average staying time of a gas in the reaction vessel 2 can be set to 0.001 to 60 seconds, preferably 0.01 to 10 seconds under the reaction condition, thereby enabling a sufficiently economical conversion rate of the chlorosilanes to be obtained.

In the silicon manufacturing apparatus described above, in the non reaction portion 3b of the reaction vessel 2, in which a carbon face is not coated by a silicon film or a silicon carbide film, the chlorosilanes in the reaction vessel 2 penetrate a pipe wall and leak externally under the specific condition.

More specifically, a leakage of the chlorosilanes occurs in the case in which a mole ratio of hydrogen to the chlorosilanes in a raw gas is large. For instance, in the case in which an amount of hydrogen to a total amount of hydrogen and the chlorosilanes exceeds 80 mol %, a leakage of the chlorosilanes occurs.

For instance, from a view point of an effective decomposition of the chlorosilanes and an improvement of deposition efficiency of silicon, a mole ratio of hydrogen to the chlorosilanes ($H_2/SiHCl_3$) is preferably in the range of 5 to 30, more preferably in the range of 10 to 20. However, in such a range of a mole ratio, the chlorosilanes penetrate a pipe wall of the non reaction portion 3b and leak externally in some cases.

In particular, in many cases, a leakage of the chlorosilanes occurs in the case in which a differential pressure is applied inside the reaction vessel 2 when a mole ratio of hydrogen is in the above range.

In a silicon manufacturing apparatus as shown in FIG. 1, in some cases, by shortening an inner diameter of the reaction vessel 2 at the intermediate section and by making an internal shape of the reaction vessel 2 complicated, a gas flow resistance change section is formed in the reaction vessel 2, and a differential pressure is set between an inlet on the upper side and an outlet on the bottom end portion 2a side in the reaction portion 3a, thereby improving a contact efficiency of a raw gas and accelerating a reaction.

However, in the case in which an amount of hydrogen to a total amount of hydrogen and the chlorosilanes exceeds 80 mol % and the above differential pressure in the reaction vessel exceeds 10 kPa, the chlorosilanes easily penetrate a pipe wall of the non reaction portion 3b and leak externally.

In the present invention, in order to prevent a gas of the chlorosilanes from penetrating a pipe wall of the non reaction portion 3b and leaking externally under the reaction condition as described above, a processing for preventing a gas penetration is carried out to the non reaction portion 3b. The following describes a specific method of the gas penetration preventing processing.

In a first method, a gas penetration is prevented by forming a coating film on the surface of the non reaction portion 3b. As a coating film, a high melting point metal such as tungsten, molybdenum, and silicon, ceramics such as silicon carbide, silicone nitride, and boron nitride, and pyrolytic carbon are preferable.

A publicly known method can be used to form a coating film on the surface of a carbon material. As a specific example thereof, there are mentioned a thermal spraying method, a chemical vapor deposition (CVD), and a coating of a molten solvent, which can be properly selected depending on a material for forming a coating film. The thermal spraying method is preferable in the case in which a material such as a high melting point metal is used as a coating film, and the CVD is preferable in the case in which a material such as ceramics and pyrolytic carbon is used as a coating film.

In the case in which a coating film of silicon is formed, as a preferable method other than the above methods, there can be mentioned a method in which a mixed gas of the chlorosilanes and hydrogen is made to come into contact with the surface of a carbon material and silicon is deposited at a temperature equivalent to or higher than a silicon generation temperature (approximately 500° C.), preferably a temperature equivalent to or less than a melting temperature of silicon.

In the case in which a coating film is formed by silicon, silicon carbide is generated on an interface of the coating film due to a reaction between silicon and carbon. Since the silicon carbide also acts as a coating film, the coating film can be used without problems.

In a second method, a fine grain with a size that can choke up minute holes in a carbon material of the reaction vessel 2 is coated on the carbon material. Such a fine grain is not restricted in particular in the case in which an elimination of the fine grain caused by decomposition or evaporation does not occur under the usage environment. As a fine grain that can be easily obtained industrially, there can be mentioned for instance a carbon fine grain, a boron nitride fine grain, and a silicon oxide fine grain.

As a method of coating, there can be mentioned for instance a method in which the above fine grain is dispersed in a suitable dispersion medium such as an organic solvent and a resin solution to make a state of dispersion liquid, and the dispersion liquid is made to adhere to the surface of the carbon material by a method such as a brush coating and a spraying, and a method in which the carbon material is immersed in the dispersion liquid.

After the fine grain dispersion liquid is coated on the carbon material, the dispersion medium is eliminated by natural evaporation, evaporation caused by heating the carbon material, or decomposition. In the case in which the fine grain is carbon, it is also preferable to further heating the carbon material after eliminating the dispersion medium and to making the fine grain to adhere to the carbon material.

The above gas penetration preventing processing can be carried out to the inside face, the outside face, or the both faces of the non reaction portion 3b. As described above, a penetration of a raw gas to the peripheral side of the reaction vessel 2 can be suppressed by forming a coating face for coating a carbon face in the non deposition portion 3b or by choking up a carbon minute hole with a fine grain.

In order to effectively prevent the chlorosilanes from penetrating a pipe wall of the non reaction portion 3b and leaking externally under the above described conditions of a mole ratio of hydrogen and a differential pressure in the reaction vessel 2, it is preferable to carry out the above processing in such a manner that a gas penetration coefficient from the inside face to the outside face of the reaction vessel 2 at the non reaction portion 3b is $1\times10^{-3}$ cm$^2$/S or less (a value obtained by a measuring method in an embodiment described later). In the case in which a carbon face to which the above processing is not carried out is exposed in a reaction vessel 2, the reaction vessel 2 has a gas penetration coefficient of $1\times10^{-1}$ cm$^2$/S in general.

It is preferable to carry out the above gas penetration preventing processing to the entire of at least one of the inside and outside faces of the non reaction portion 3b in practice. Moreover, it is also possible to carry out the above processing to at least a part of the reaction portion 3a. In particular, in the case in which the gas penetration preventing processing is carried out only to the outside face, it is preferable to carry out the processing to a range as wide as possible including the non reaction portion 3b, preferably to the entire of the outside face.

As a prior art, it is publicly known to coat a region to which silicon is deposited by using a material having a comparatively high resistance as compared with a silicon molten solvent in order to improve a resistance of the reaction vessel 2 and a purity of a silicon product. However, this is carried out to the section in which deposited silicon deposits to a pipe wall face depending on a silicon deposition, and a position of a purpose and an object is different from that of the present invention in which the processing is carried out to the non reaction portion 3b that is a section to which silicon is not deposited.

EXAMPLES

Figure 2:
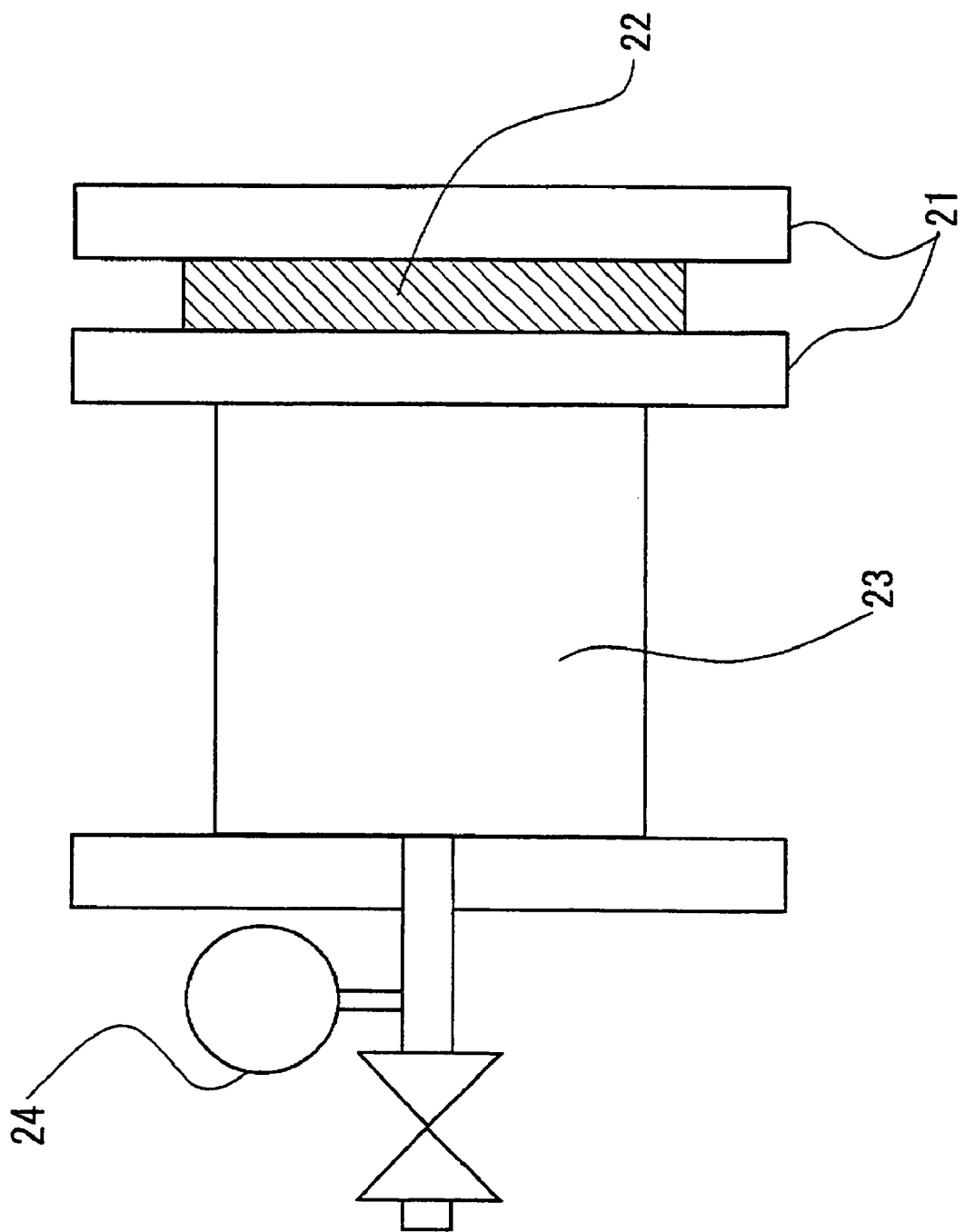
FIG. 2 is a view for illustrating a measuring apparatus of a gas penetration coefficient.

While the preferred examples of the present invention will be described in the following, the present invention is not restricted to the examples. In the following examples, a gas penetration coefficient was measured by the following method using an apparatus shown in FIG. 2. A carbon plate 22 related to Examples 1 to 9 and Comparative examples 1 and 2 was interposed between flanges 21 made of a stainless steel, and the contact portions of the carbon plate 22 and the flanges 21 were coated by an O ring and a fluorocarbon resin paste.

Subsequently, a chamber 23 made of a stainless steel was filled with a nitrogen gas, and the inside of the chamber was pressurized up to 400 kPa at a normal temperature. Since the outside of the chamber 23 is an air open system, the following calculation was carried out while an outside pressure was a constant value of 0 kPaG.

A pressure change in the chamber 23 was measured by a pressure gage 24 after a pressure in the chamber 23 was started to be reduced by passing of a nitrogen gas in the chamber 23 through a minute hole in the carbon plate 22. While approximating a pressure reduction speed in the chamber 23 in a unit time to a straight line, a gas penetration amount Q was then obtained by the expression of Q [cm$^3$·Pa/s]=V×((P2−P1)/(T2−T1)), where V is a total volume of the chamber 23, the pressure gage 24, and the inside of the pipe, P1 is a pressure in the chamber 23 at time T1 after the start of a pressure reduction (T1 is approximately 0 s), and P2 is a pressure in the chamber 23 at time T2 after the start of a pressure reduction.

By using the obtained gas penetration amount Q, a gas penetration coefficient K [cm$^2$/s] was obtained by the expression of K=Q·L/(ΔP·A), where L [cm] is a gas penetration thickness of the carbon plate 22, ΔP [Pa] is a differential pressure in a thickness L of the carbon plate 22, and A [cm$^2$] is a nitrogen gas penetration area.

In the present embodiments, the total volume V of the chamber 23, the pressure gage 24, and the inside of the pipe was 427 cm$^3$, and the nitrogen gas penetration area A of the carbon plate 22 is 46.6 cm$^2$. Since the carbon plate 22 is in a disc shape, the nitrogen gas penetration area A is a total sum of an area of the peripheral portion and an area of the outside faces of the disc.

Example 1

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and metal tungsten was thermal-sprayed to one face of the carbon plate, thereby forming a tungsten metal film with a thickness of 1 μm. For this carbon plate, a gas penetration coefficient was measured by the above method.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), a tungsten metal film with a thickness of 1 μm was formed on the inside face on the side upper than the reaction portion in the reaction vessel as described above, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Example 2

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, one face of the carbon plate was heated to a silicon generation temperature (500° C.), and a silicon carbide film with a thickness of 1 μm was formed by supplying trichlorosilane and hydrogen with a molar fraction of 50% to the surface thereof. For this carbon plate, a gas penetration coefficient was measured. Table 1 shows the measurement results.

Example 3

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and one face of the carbon plate was made to come into contact with molten silicon, thereby forming a silicon carbide film with a thickness of 1 μm. For this carbon plate, a gas penetration coefficient was measured.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), a silicon carbide film with a thickness of 1 μm was formed on the inside face on the side upper than the reaction portion in the reaction vessel as described above, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Example 4

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and silicon carbide was deposited on one face of the carbon plate by a chemical vapor deposition (CVD). For this carbon plate, a gas penetration coefficient was measured. Table 1 shows the measurement results.

Example 5

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and a carbon fine grain (a paste containing a phenol resin: an average carbon grain diameter of 1 μm, and a carbon component rate of 20%) was coated and impregnated to one face of the carbon plate. Subsequently, a liquid component contained in the liquid carbon material was eliminated at a temperature of 200° C., and carbon was heated and stuck. For this carbon plate, a gas penetration coefficient was measured.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), the inside face on the side upper than the reaction portion in the reaction vessel was processed by the liquid carbon material as described above, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Example 6

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and dispersion liquid of a boron nitride fine grain (with an average grain diameter of 0.1 μm) was impregnated to one face of the carbon plate by spray coating. For this carbon plate, a gas penetration coefficient was measured. Table 1 shows the measurement results.

Example 7

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and a liquid substance containing a silicon oxide fine grain (an average grain diameter of 0.1 μm, and a silicon oxide rate of 20%) was coated on one face of the carbon plate. Subsequently, a liquid component contained in the liquid substance was eliminated at a temperature of 1500° C., and the silicon oxide fine grain was heated and stuck. For this carbon plate, a gas penetration coefficient was measured.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), the inside face on the side upper than the reaction portion in the reaction vessel was processed by the liquid substance containing a silicon oxide fine grain as described above, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Example 8

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and a pyrolytic carbon coating film was formed on one face of the carbon plate by a chemical vapor deposition (CVD). For this carbon plate, a gas penetration coefficient was measured.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), a pyrolytic carbon coating film was formed on the inside face on the side upper than the reaction portion in the reaction vessel, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Example 9

There was prepared a carbon plate in a disc shape that is made of a carbon material (a product on the market, a high density isotropic carbon with a density of 1.82 g/cm$^3$) being used for a reaction vessel of the above described silicon manufacturing apparatus and that has a diameter of 60 mm and a thickness of 5 mm, and a pyrolytic carbon coating film was formed on the both faces of the carbon plate by a chemical vapor deposition (CVD). For this carbon plate, a gas penetration coefficient was measured.

Moreover, by using a reaction vessel made of a carbon material similar to the above (a diameter was 100 mm, an inner diameter was 70 mm, a total length was 1500 mm, and a length of the reaction portion was 1000 mm, and a gas flow resistance change section was formed in the vessel), a pyrolytic carbon coating film was formed on the inside face and the outside face on the side upper than the reaction portion in the reaction vessel, and the reaction vessel was installed to the silicon manufacturing apparatus.

A mixed gas of trichlorosilane of 20 kg/H and hydrogen of 40 Nm$^3$/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm$^3$) installed on the outside wall of the reaction vessel was measured, and a weight reduction speed (a heat insulating material deterioration speed) was calculated. Table 1 shows the measurement results of a gas penetration coefficient and a heat insulating material deterioration speed.

Comparative Examples 1 and 2

There was prepared a carbon plate in a disc shape that is made of a carbon material (Comparative example 1: a product on the market, a high density isotropic carbon with a density of 1.82 g/cm³; Comparative example 2: a product on the market, a general purpose isotropic carbon with a density of 1.77 g/cm³) being used for a reaction vessel of the above described silicon manufacturing apparatus and that has a diameter of 60 mm and a thickness of 5 mm, and a gas penetration coefficient was measured for this carbon plate.

Moreover, a reaction vessel made of a carbon material similar to the above (a diameter was 100 mm, an inner diameter was 70 mm, a total length was 1500 mm, and a length of the reaction portion was 1000 mm, and a gas flow resistance change section was formed in the pipe) was installed to the silicon manufacturing apparatus.

A mixed gas of trichlorosilane of 20 kg/H and hydrogen of 40 Nm³/H was then flown into the reaction vessel under the condition in which a differential pressure was 10 kPa between an inlet on the upper side and an outlet on the bottom end portion side in the reaction portion, the reaction vessel was heated to 1500° C., and an operation was carried out for 100 hours. After the operation, a weight of a carbon heat insulating material (a diameter was 170 mm, an inner diameter was 100 mm, a length was 1000 mm, and a carbon density was 0.16 g/cm³) installed on the outside wall of the reaction vessel was measured, and a weight reduction speed (a heat insulating material deterioration speed) was calculated. Table 1 shows the measurement results of a gas penetration coefficient and a heat insulating material deterioration speed.

TABLE 1

|  | Processing item | Gas penetration coefficient (cm²/s) | Heat insulating material deterioration speed |
|---|---|---|---|
| Example 1 | W film (metal thermal spraying) | $<2.0 \times 10^{-6}$ | $<0.1$ wt %/day |
| Example 2 | Silicon carbide film (CVD) | $<2.0 \times 10^{-6}$ | — |
| Example 3 | Silicon carbide film (contact with molten silicon) | $<2.0 \times 10^{-6}$ | $<0.1$ wt %/day |
| Example 4 | Choking up with silicon carbide fine grain (CVD) | $1.0 \times 10^{-6}$ | — |
| Example 5 | Impregnation of liquid carbon material | $1.0 \times 10^{-3}$ | 0.1 wt %/day |
| Example 6 | Spray coating of boron nitride fine grain | $1.0 \times 10^{-2}$ | — |
| Example 7 | Impregnation of liquid containing silicon oxide fine grain | $2.0 \times 10^{-2}$ | 2.0 wt %/day |
| Example 8 | Pyrolytic carbon coating (CVD, one face) | $<2.0 \times 10^{-6}$ | $<0.1$ wt %/day |
| Example 9 | Pyrolytic carbon coating (CVD, both faces) | $<2.0 \times 10^{-6}$ | $<0.1$ wt %/day |
| Comparative example 1 | No processing (carbon bulk density: 1.82 g/cm³) | $1.0 \times 10^{-1}$ | 13.8 wt %/day |
| Comparative example 2 | No processing (carbon bulk density: 1.77 g/cm³) | $2.0 \times 10^{-1}$ | 30 wt %/day |

The invention claimed is:

1. A reaction apparatus for chlorosilane compound comprising:
a tubular reaction vessel being made of a carbon material, and a gas supply port formed on an upper side of the reaction vessel for supplying chlorosilanes and hydrogen to the reaction vessel, wherein the tubular reaction vessel defines a reaction portion and a non-reaction portion, the reaction portion extending from a bottom end portion of the reaction vessel to a predetermined height in the reaction vessel, the reaction portion having an inside face to which silicon is deposited, the non-reaction portion of the reaction vessel being provided at an upper section of the reaction vessel, the non-reaction portion of the reaction vessel including an inside face and an outside face,
wherein the inside face or the outside face of the non-reaction portion of the reaction vessel includes a gas penetration preventing coating for preventing chlorosilanes supplied to the reaction vessel from penetrating a pipe wall of the reaction vessel, and
wherein the chlorosilanes and hydrogen are supplied in such a way that an amount of hydrogen to a total amount of hydrogen and chlorosilanes exceeds 80 mol % and a differential pressure between an inlet on the upper side and an outlet on the bottom end portion side in the reaction portion exceeds 10 kPa.

2. The reaction apparatus of claim 1, wherein a gas penetration coefficient from the inside face to the outside face of the reaction vessel at the non-reaction portion is $1 \times 10^{-3}$ cm²/S or less.

3. A method comprising:
supplying chlorosilanes and hydrogen to a reaction vessel from a gas supply port formed on an upper side of the reaction vessel, the reaction vessel being made of a carbon material and defining a reaction portion and a non-reaction portion, the reaction portion extending from a bottom end portion of the reaction vessel to a predetermined height in the reaction vessel, the reaction portion having an inside face to which silicon is deposited, the non-reaction portion of the reaction vessel being provided at an upper section of the reaction vessel, the non-reaction portion of the reaction vessel including an inside face and an outside face;
heating the reaction portion of the reaction vessel up to at least a temperature at which a reaction occurs;
reacting the chlorosilanes by making the chlorosilanes and hydrogen come into contact with the inside face of the reaction portion of the reaction vessel;
performing a gas penetration preventing processing to at least one of the inside face and the outside face of the non-reaction portion of the reaction vessel,
wherein the chlorosilanes and hydrogen are supplied in such a way that an amount of hydrogen to a total amount of hydrogen and chlorosilanes exceeds 80 mol % and a differential pressure between an inlet on the upper side and an outlet on the bottom end portion side in the reaction portion exceeds 10 kPa.

* * * * *